(12) United States Patent
Yoon et al.

(10) Patent No.: US 9,900,987 B2
(45) Date of Patent: Feb. 20, 2018

(54) COIL COMPONENT AND BOARD FOR MOUNTING THE SAME

(71) Applicant: SAMSUNG ELECTRO-MECHANICS CO., LTD., Suwon-si, Gyeonggi-do (KR)

(72) Inventors: Chan Yoon, Suwon-si (KR); Dong Hwan Lee, Suwon-si (KR); Young Ghyu Ahn, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/089,805

(22) Filed: Apr. 4, 2016

(65) Prior Publication Data

US 2017/0006706 A1 Jan. 5, 2017

(30) Foreign Application Priority Data

Jul. 1, 2015 (KR) .......................... 10-2015-0094034

(51) Int. Cl.
*H01F 27/28* (2006.01)
*H05K 1/18* (2006.01)
(Continued)

(52) U.S. Cl.
CPC ......... *H05K 1/181* (2013.01); *H01F 17/0013* (2013.01); *H01F 17/0033* (2013.01);
(Continued)

(58) Field of Classification Search
CPC .......... H01F 17/02; H01F 17/03; H01F 17/04; H01F 17/0013; H01F 17/0033;
(Continued)

(56) References Cited

U.S. PATENT DOCUMENTS 5,400,006 A * 3/1995 Cardozo ................. H01F 38/30
336/175
2003/0137384 A1* 7/2003 Itou ....................... H01F 17/0013
336/200

(Continued)

FOREIGN PATENT DOCUMENTS

JP 10-270256 A 10/1998
JP 2014-187276 A 10/2014
KR 10-2005-0011090 A 1/2005

*Primary Examiner* — Timothy Thompson
*Assistant Examiner* — Guillermo Egoavil
(74) *Attorney, Agent, or Firm* — McDermott Will & Emery LLP

(57) ABSTRACT

There are provided a coil component and a board for mounting the same. The coil component includes a magnetic body including first and second coil portions disposed on one surface of a substrate and disposed linearly, based on a central portion of the magnetic body, and third and fourth coil portions disposed on the other surface of the substrate and disposed linearly, based on the central portion of the magnetic body; and first to fourth external electrodes disposed on an external surface of the magnetic body and connected to the first to fourth coil portions. The first coil portion and the third coil portion have a first core portion, and the second coil portion and the fourth coil portion have a second core portion. A peripheral portion disposed outwardly of the first to fourth coil portions has greater permeability than that of the first and second core portions.

14 Claims, 5 Drawing Sheets

(51) Int. Cl.
  *H01F 27/29* (2006.01)
  *H01F 17/00* (2006.01)
  *H01F 17/04* (2006.01)

(52) U.S. Cl.
  CPC ............ *H01F 17/04* (2013.01); *H01F 27/292* (2013.01); *H01F 2017/048* (2013.01); *H05K 2201/1003* (2013.01)

(58) Field of Classification Search
  CPC ...... H01F 27/24; H01F 27/027; H01F 27/292; H01F 27/255; H01F 27/365; H01F 27/2804; H01F 2017/048; H01F 2017/0093; H01F 37/00; H01F 17/0006; H05K 1/181; H05K 3/3442; H05K 2201/1003; H05K 2201/09381; H05K 1/165; H05K 1/0233; H01L 2224/16227; H01L 2224/32145; H01L 2224/32225; H01L 2224/73204; H01L 2225/1023; H01L 2225/1058; H01L 2924/15313; H01L 2924/15331; H01L 2924/19106; H01R 12/57; Y02P 70/613
  USPC ............. 174/260; 336/84 M, 192, 220, 200; 439/894
  See application file for complete search history.

(56) References Cited

U.S. PATENT DOCUMENTS

| | | | |
|---|---|---|---|
| 2005/0181684 A1* | 8/2005 | Ito | H05K 3/3442 439/894 |
| 2014/0253279 A1* | 9/2014 | Doyle | H01F 27/365 336/84 M |
| 2014/0320249 A1* | 10/2014 | Nobusaka | H01F 27/02 336/90 |
| 2016/0078994 A1* | 3/2016 | Yoon | H01F 17/0013 336/192 |
| 2016/0078995 A1* | 3/2016 | Yoon | H01F 17/0013 336/192 |
| 2016/0211071 A1* | 7/2016 | Jeong | H01F 27/292 |
| 2017/0148561 A1* | 5/2017 | Yoon | H01F 27/255 |

* cited by examiner

X – X'

COIL COMPONENT AND BOARD FOR MOUNTING THE SAME

CROSS-REFERENCE TO RELATED APPLICATION

This application claims benefit of priority to Korean Patent Application No. 10-2015-0094034 filed on Jul. 1, 2015, with the Korean Intellectual Property Office, the disclosure of which is incorporated herein by reference.

TECHNICAL FIELD

The present disclosure relates to a coil component and a board for mounting the same.

BACKGROUND

The transmission and reception of data within a high frequency band is widely used in electronic devices such as a digital TVs, smartphones, notebook computers, and the like. In the future, it is expected that frequencies utilized by the above-mentioned information technology (IT) electronic products will be relatively high, in accordance with the multifunctionalization and increases in the degree of complexity of electronic devices, due to IT products connecting universal serial buses and other communications ports between IT electronic products, as well as in single devices.

In accordance with evolution of the smartphone, demand for thin power inductors capable of handling high currents while having a small size, high efficiency, and high performance has increased.

Therefore, a 2520-sized product having a thickness of 1mm was employed in the past, while a 2016-sized product having the thickness of 1 mm is currently being employed. In the future, it is expected that inductors will be miniaturized to 1608-sized products in which a thickness is reduced to 0.8 mm.

At the same time, demand for an array having an advantage that a mounting area may be reduced has also increased.

The array may be a non-coupled type array, a coupled inductor type array, or a combination thereof, depending on a coupling coefficient or mutual inductance between a plurality of coil portions of the array.

Meanwhile, in the case of the noncoupled inductor array chip in which the plurality of coil portions are disposed to be spaced apart from each other and are not affected by magnetic flux, if inductances of the respective coils may be implemented to be the same, a mounting area may be reduced and efficiency of the inductor array chip may be increased at the same time.

In many applications, demand for the noncoupled inductor array chip exists, but there has been a problem in that the noncoupled inductor array chip is not a structure in which the respective coils have the same inductance value.

Thus, there is a need to implement a noncoupled inductor array product in which the respective coils have the same inductance value and are not affected by the magnetic flux.

SUMMARY

An aspect of the present disclosure may provide a coil component and a board for mounting the same.

According to an aspect of the present disclosure, a coil component may include a magnetic body including first and second coil portions disposed on one surface of a substrate and disposed linearly, based on a central portion of the magnetic body, and third and fourth coil portions disposed on the other surface of the substrate and disposed linearly, based on the central portion of the magnetic body; and first to fourth external electrodes disposed on an external surface of the magnetic body and connected to the first to fourth coil portions. The first coil portion and the third coil portion have a first core portion, and the second coil portion and the fourth coil portion have a second core portion. A peripheral portion disposed outwardly of the first to fourth coil portions has greater permeability than that of the first and second core portions.

According to another aspect of the present disclosure, a board for mounting a coil component may include: a printed circuit board having a plurality of electrode pads disposed thereon; and the coil component installed on the printed circuit board. The coil component includes: a magnetic body including first and second coil portions disposed on one surface of a substrate and disposed linearly, based on a central portion of the magnetic body, and third and fourth coil portions disposed on the other surface of the substrate and disposed linearly, based on the central portion of the magnetic body; and first to fourth external electrodes disposed on an external surface of the magnetic body and connected to the first to fourth coil portions. The first coil portion and the third coil portion have a first core portion, and the second coil portion and the fourth coil portion have a second core portion. A peripheral portion disposed outwardly of the first to fourth coil portions has greater permeability than the first and second core portions.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
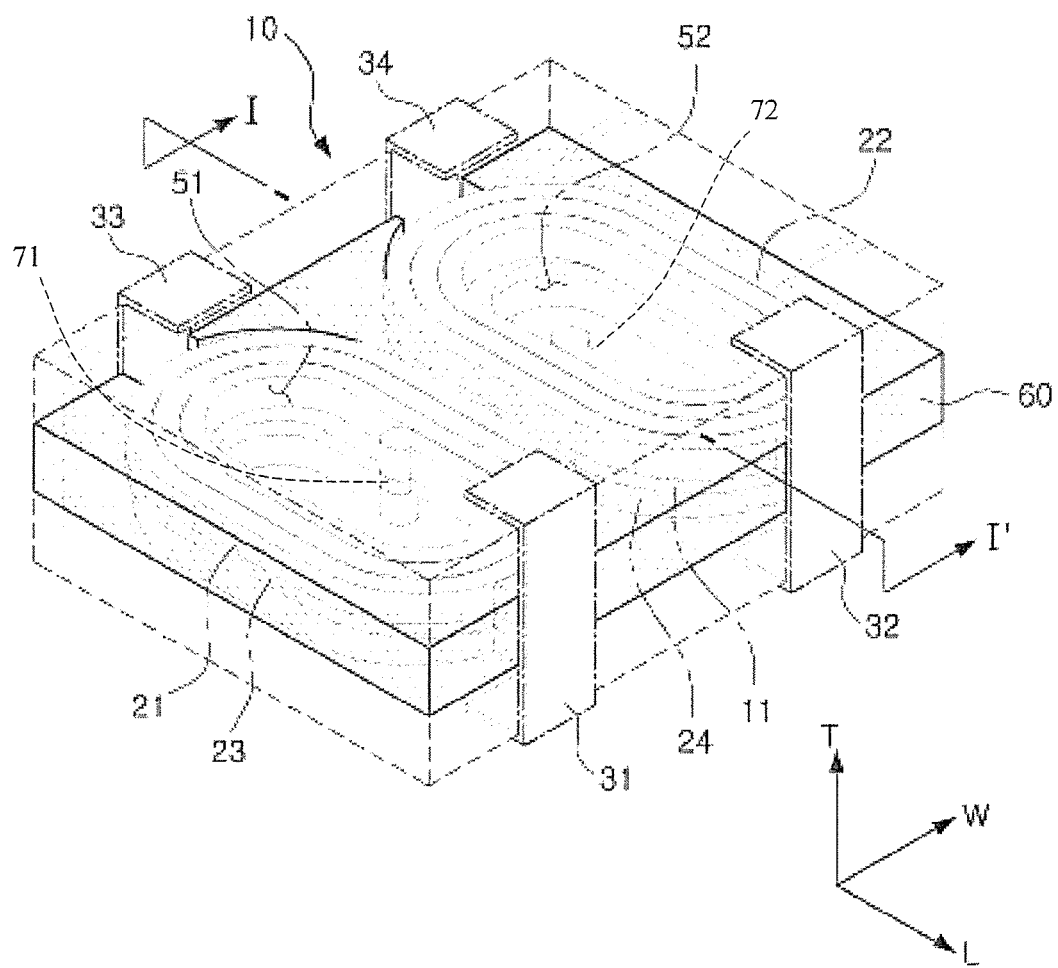
FIG. 1 is an internal perspective view of a coil component according to an exemplary embodiment in the present disclosure.

Hereinafter, embodiments of the present inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise.

It will be further understood that the terms "comprises, " and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present inventive concept will be described with reference to schematic views illustrating embodiments of the present inventive concept. In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

The contents of the present inventive concept described below may have a variety of configurations and propose only a required configuration herein, but are not limited thereto.

Coil Component

A coil component according to an exemplary embodiment in the present disclosure may include a magnetic body including first and second coil portions disposed on one surface of a substrate and disposed linearly, based on a central portion of the magnetic body and third and fourth coil portions disposed on the other surface of the substrate and disposed linearly, based on the central portion of the magnetic body, and first to fourth external electrodes disposed on an external surface of the magnetic body and connected to the first to fourth coil portions.

In the present exemplary embodiment, defined terms as referred to "first" to "fourth" are to merely distinguish the object, and are not limited to the above-mentioned order.

The magnetic body may be a hexahedron, and an "L direction" refers to a "length direction", a "W direction" refers to a "width direction", and a "T direction" refers to a "thickness direction".

The magnetic body may include the substrate, the first and second coil portions disposed on one surface of the substrate and disposed linearly, based on the central portion of the magnetic body, and the third and fourth coil portions disposed on the other surface of the substrate and disposed linearly, based on the central portion of the magnetic body.

The substrate may be a magnetic substrate, and the magnetic body may include a Ni—Zn—Cu ferrite, but is not limited thereto.

In addition, the coil component according to an exemplary embodiment in the present disclosure may include the first and second external electrodes formed on one surface of the magnetic body, and the third and fourth external electrodes formed on the other surface of the magnetic body opposing one surface of the magnetic body.

Hereinafter, the first to fourth coil portions, the first to fourth external electrodes, and the magnetic body will be described with reference to the accompanying drawings.

FIG. 1 is an internal perspective view of the coil component according to an exemplary embodiment in the present disclosure.

Figure 2:
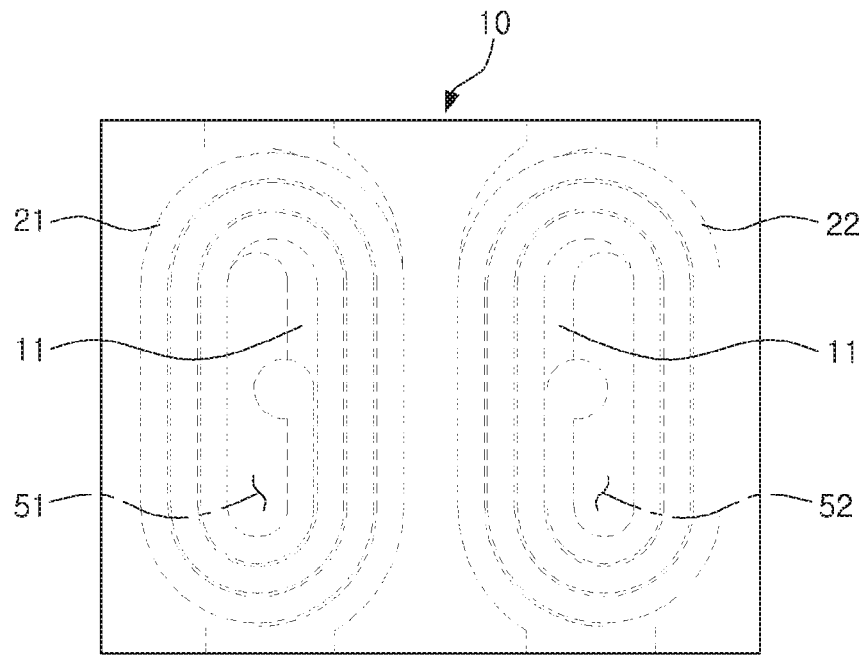
FIG. 2 is a plan view of the coil component of FIG. 1.

FIG. 2 is a plan view of the coil component of FIG. 1.

Figure 3:
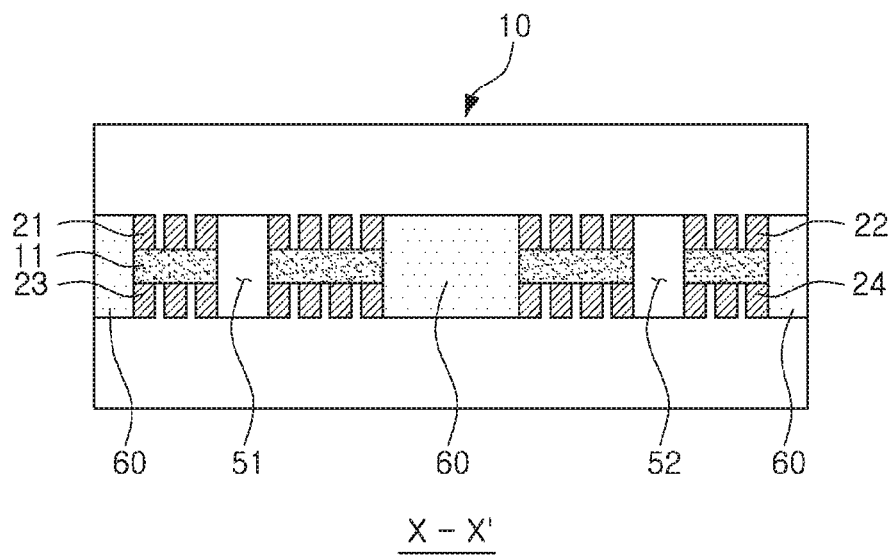
FIG. 3 is a cross-sectional view taken along line X-X' of FIG. 1.

FIG. 3 is a cross-sectional view taken along line X-X' of FIG. 1.

Referring to FIGS. 1 through 3, a coil component according to an exemplary embodiment in the present disclosure may include a magnetic body 10 including first and second coil portions 21 and 22 disposed on one surface of a substrate 11 and disposed linearly, based on a central portion of the magnetic body 10, and third and fourth coil portions 23 and 24 disposed on the other surface of the substrate 11 and disposed linearly, based on the central portion of the magnetic body 10, and first to fourth external electrodes 31, 32, 33, and 34 disposed on an external surface of the magnetic body 10 and connected to the first to fourth coil portions 21, 22, 23, and 24. The first coil portion 21 and the third coil portion 23 may have a first core portion 51, the second coil portion 22 and the fourth coil portion 24 may have the second core portion 52, and a peripheral portion 60 disposed outwardly of the first to fourth coil portions 21, 22, 23, and 24 may have greater permeability than the first and second core portions 51 and 52.

Referring to FIGS. 1 through 3, the first coil portion 21 and the second coil portion 22 may be disposed on one surface of the substrate 11 to be spaced apart from each other, and may be disposed linearly, based on a central portion of the magnetic body 10 in a length direction of the magnetic body 10.

In addition, the third coil portion 23 and the fourth coil portion 24 may be disposed on the other surface of the substrate 11 to be spaced apart from each other, and may be disposed linearly, based on the central portion of the magnetic body 10 in the length direction of the magnetic body 10.

The first coil portion 21 and the second coil portion 22 may have a symmetrical structure based on the central portion of the magnetic body 10, and the third coil portion 23 and the fourth coil portion 24 may also have the symmetrical structure based on the central portion of the magnetic body 10.

The central portion of the magnetic body 10 may mean a central portion region of the magnetic body 10 in the length direction of the magnetic body 10, and may not mean a point accurately spaced apart from both end portions of the magnetic body 10 in the length direction of the magnetic body 10 by the same distance.

A magnetic center in the each of the first and second coil portions 21 and 22 in a shape in which the first and second coil portions 21 and 22 are wound may be referred to as a core. Hereinafter, the same conception as that described above will be used.

In addition, on the other surface of the substrate 11, since the center in a shape in which the third coil portion 23 is wound and the center in a shape in which the fourth coil portion 24 is wound may be referred to as the core, the substrate 11 may have two cores 51 and 52.

According to an exemplary embodiment in the present disclosure, since the first coil portion 21 and the second coil portion 22 have a symmetrical structure on the basis of the central portion of the magnetic body 10, and the third coil portion 23 and the fourth coil portion 24 have the symmetrical structure on the basis of the central portion of the magnetic body 10, the first and second coil portions 21 and 22 and the third and fourth coil portions 23 and 24 may have the same inductance value.

In addition, since the first coil portion 21 and the second coil portion 22, and the third coil portion 23 and the fourth coil portion 24 have a symmetrical structure in a shape in the mirror on the basis of the central portion of the magnetic body 10 in a thickness direction of the magnetic body 10, the first and second coil portions 21 and 22 and the third and fourth coil portions 23 and 24 may have the same inductance value.

Particularly, according to an exemplary embodiment in the present disclosure, each of the first to fourth coil portions 21, 22, 23, and 24 may have higher coil density in regions adjacent to the central portion of the magnetic body 10 than that in regions adjacent to end portions of the magnetic body 10.

Each of the first to fourth coil portions 21, 22, 23, and 24 may be disposed so that the coil density in the regions adjacent to the central portion of the magnetic body 10 is higher than that in the regions adjacent to the end portions of the magnetic body 10, thereby increasing self inductance.

Referring to FIG. 3, it may be seen that four coil cross sections of the first coil portion to the fourth coil portion 21, 22, 23, and 24 are disposed in each of the regions adjacent to the central portion of the magnetic body 10.

In addition, it may be seen that three coil cross sections of the first coil portion to the fourth coil portion 21, 22, 23, and 24 are disposed in each of the regions adjacent to the end portions of the magnetic body 10.

That is, according to an exemplary embodiment in the present disclosure, each of the first to fourth coil portions 21, 22, 23, and 24 may be disposed so that the coil density in the regions adjacent to the central portion of the magnetic body 10 is higher than that in the regions adjacent to the end portions of the magnetic body 10, thereby increasing self inductance.

Although FIG. 3 illustrates a case in which four coils are disposed in the regions adjacent to the central portion of the magnetic body 10 and three coils are disposed in the regions adjacent to the end portions of the magnetic body 10, the present disclosure is not limited thereto.

Meanwhile, one end of each of the first coil portion 21 and the second coil portion 22 is exposed to one surface of the magnetic body 10 in a width direction of the magnetic body 10 and one end of each of the third coil portion 23 and the fourth coil portion 24 is exposed to the other surface of the magnetic body 10 in the width direction of the magnetic body 10, so as to be connected to the first to fourth external electrodes 31, 32, 33, and 34.

That is, in a case in which one end of the first coil portion 21 is exposed to a first surface of the magnetic body 10 in the width direction of the magnetic body 10, one end of the second coil portion 22 disposed on the same plane as the first coil portion 21 to be spaced apart from each other and wound linearly, based on the central portion of the magnetic body 10 may be exposed to one surface of the magnetic body 10 in the width direction of the magnetic body 10 and may be exposed to a position spaced apart from the exposed position of the first coil portion 21.

One end of the first coil portion 21 exposed as described above may be connected to the first external electrode 31, and one end of the second coil portion 22 may be connected to the second external electrode 32.

In addition, the first coil portion 21 and the second coil portion 22 may have a symmetrical shape on the basis of the center of the magnetic body 10.

Due to the above-mentioned characteristics, the first coil portion 21 and the second coil portion 22 may have the same length as each other.

Similarly, one end of the third coil portion 23 disposed on the other surface of the substrate 11 may be exposed to a second surface of the magnetic body 10 in the width direction of the magnetic body 10.

That is, one end of the fourth coil portion 24 disposed on the same plane as the third coil portion 23 to be spaced apart from each other and wound linearly, based on the central portion of the magnetic body 10 may be exposed to the second surface of the magnetic body 10 in the width direction of the magnetic body 10 and may be exposed to a position spaced apart from the exposed position of the third coil portion 23.

One end of the third coil portion 23 exposed as described above may be connected to the third external electrode 33, and one end of the fourth coil portion 24 may be connected to the fourth external electrode 34.

In addition, the third coil portion 23 and the fourth coil portion 24 may have the same length as each other.

As described above, the first to fourth coil portions 21, 22, 23 and 24 may be exposed to one surface and the other surface of the magnetic body 10 to be spaced apart from each other, so as to be connected to the first to fourth external electrodes 31, 32, 33, and 34, respectively.

The first and second external electrodes 31 and 32 may be input terminals and the third and fourth external electrodes 33 and 34 may be output terminals, but are not limited thereto.

Meanwhile, the first coil portion 21 and the second coil portion 22 may be formed on the same plane, a top of the insulating substrate 11, the third coil portion 23 and the fourth coil portion 24 may be formed on the same plane, a bottom of the insulating substrate 11, and the first coil portion 21 and the third coil portion 23 may be connected to each other by a via 71.

Similarly, the second coil portion 22 and the fourth coil portion 24 may be connect to each other by a via 72.

Thus, a current input to the first external electrode 31, the input terminal, may flow into the third external electrode 33, the output terminal, through the first coil portion 21, the via, and the third coil portion 23.

Similarly, a current input to the second external electrode 32, the input terminal, may flow into the fourth external electrode 34, the output terminal, through the second coil portion 22, the via, and the fourth coil portion 24.

The first coil portion 21 and the second coil portion 22 have a symmetrical structure based on the central portion of the magnetic body 10, and the third coil portion 23 and the fourth coil portion 24 also have the symmetrical structure based on the central portion of the magnetic body 10, such that the coil component according to an exemplary embodiment in the present disclosure may have a noncoupled inductor array shape.

In addition, the first and second coil portions 21 and 22, and the third and fourth coil portions 23 and 24 disposed on each of the top and the bottom of the substrate 11 may form a symmetrical flow of magnetic flux by the above-mentioned structure.

Thus, the respective coils have the symmetrical structure in the shape in the mirror on the basis of a central portion of the coil component, such that the inductances of the respective coils may be implemented to be the same, thereby reducing a mounting area and increasing efficiency of an inductor array chip.

The first to fourth coil portions 21, 22, 23, and 24 may include one or more selected from a group consisting of gold, silver, platinum, copper, nickel, palladium, and alloys thereof.

The first to fourth coil portions 21, 22, 23, and 24 may be formed of a material capable of applying conductivity to a coil, and are not limited to the listed metals.

In addition, the first to fourth coil portions 21, 22, 23, and 24 may have a polygonal shape, a circular shape, an oval shape, or an irregular shape, and a shape thereof is not particularly limited.

The first to fourth coil portions 21, 22, 23, and 24 may be connected to the first to fourth external terminals 32, 32, 33, and 34 through the respective leading terminals (not labeled).

The external electrodes may include the first to fourth external electrodes 31, 32, 33, and 34.

The first to fourth external electrodes 31, 32, 33, and 34 may be formed to be extended in a thickness direction ("T direction") of the magnetic body 10.

The first to fourth external electrodes 31, 32, 33, and 34 may be disposed to be spaced apart from each other and may be electrically insulated from each other.

The first to fourth external electrodes 31, 32, 33, and 34 may be formed to be extended to portions of a top surface and a bottom surface of the magnetic body 10.

Since bonding portions between the first to fourth external electrodes 31, 32, 33, and 34 and the magnetic body 10 have an angle shape including bent portions affixed to surfaces of the magnetic body 10 in the thickness direction, fixing strength between the first to fourth external electrodes 31, 32, 33, and 34 and the magnetic body 10 may be improved, and resistance to external impacts, or the like, may be improved.

As long as a metal may provide electrical conductivity to the first to fourth external electrodes 31, 32, 33, and 34, the metal configuring the first to fourth external electrodes 31, 32, 33, and 34 is not particularly limited.

Specifically, the first to fourth external electrodes 31, 32, 33, and 34 may include one or more selected from a group consisting of gold, silver, platinum, copper, nickel, palladium, and alloys thereof.

Gold, silver, platinum, and palladium have a disadvantage that they are high in price, but are stable, and copper and nickel have an advantage that they are low in price, but are oxidized during a sintering to deteriorate electrical conductivity.

A thickness of the magnetic body 10 may be 1.2 mm or less, but is not limited thereto, and the magnetic body 10 may be manufactured to have various thicknesses.

The magnetic body 10 may include a ferrite or metallic magnetic particle, but is not limited thereto. For example, the magnetic body 10 may include any material without being limited as long as it exhibits magnetic properties.

The metallic magnetic particle may be an alloy containing any one or more selected from a group consisting of iron (Fe), silicon (Si), chromium (Cr), aluminum (Al), and nickel (Ni). For example, the metallic magnetic particle may include Fe—Si—B—Cr based amorphous metal particles, but is not limited thereto.

The metallic magnetic particle may be included in a form diffused in an epoxy resin or a polymer such as polyimide, or the like.

According to an exemplary embodiment in the present disclosure, the peripheral portion 60 disposed outwardly of the first to fourth coil portions 21, 22, 23, and 24 may have greater permeability than the first and second core portions 51 and 52.

The coil component according to an exemplary embodiment in the present disclosure may have the noncoupled inductor array shape, and in the noncoupled power inductor array shape, it may be important to significantly reduce mutual inductance by decreasing a coupling coefficient between two coils.

However, if the coupling coefficient is equal to a specific value or more, a voltage rising phenomenon in a micro current region may occur due to the mutual inductance between the two coils.

According to an exemplary embodiment in the present disclosure, the peripheral portion 60 disposed at the outer portion of the first to fourth coil portions 21, 22, 23, and 24 may be disposed to have greater permeability than the first and second core portions 51 and 52, thereby reducing the coupling coefficient.

That is, the peripheral portion 60 disposed at the outer portion of the first to fourth coil portions 21, 22, 23, and 24 is filled with a material having high permeability, such that a flow of magnetic flux that magnetic flux generated from the first and third coil portions 21 and 23 moves on the second and fourth coil portions 22 and 24, which are other coil portions, may be reduced.

Thereby, leakage inductance may be increased and mutual inductance may be reduced, thereby reducing the coupling coefficient.

A method for disposing the peripheral portion 60 disposed at the outer portion of the first to fourth coil portions 21, 22, 23, and 24 to have greater permeability than the first and second core portions 51 and 52 may be performed by using materials of which permeability of a magnetic material filled in the peripheral portion 60 and permeability of a magnetic material filled in the first and second core portions 51 and 52 are different. For example, a method of using a material of which permeability of the magnetic material filled in the first and second core portions 51 and 52 is 31 $H \cdot m^{-1}$ and permeability of the magnetic material filled in the peripheral portion 60 is 40 H·m$^{-1}$, and the like may be used.

Alternatively, a filling rate of a ferrite or a metallic magnetic particle filled in the peripheral portion 60 and the first and second core portions 51 and 52 may be set to be different, thereby allowing permeability to be different. However, the method for disposing the peripheral portion 60 disposed at the outer portion of the first to fourth coil portions 21, 22, 23, and 24 to have greater permeability than the first and second core portions 51 and 52 is not limited thereto, and any method may be used as long as it may adjust permeability to be different.

For example, a difference between permeability of the peripheral portion 60 and permeability of the first and second core portions 51 and 52 may be 9 to 40 H·m$^{-1}$ According to an exemplary embodiment in the present disclosure, the central portion of the magnetic body 10 may have greater permeability than the first and second core portions 51 and 52.

The central portion of the magnetic body 10 may mean the central portion region of the magnetic body 10 in the length direction of the magnetic body 10 as described above, and may not mean the point exactly spaced apart from both end portions of the magnetic body 10 in the length direction of the magnetic body 10 by the same distance.

Permeability of the magnetic material filled in the central portion of the magnetic body 10, which is a portion of the peripheral portion 60, may be greater than that of the magnetic material filled in the first and second core portions 51 and 52, and may also be the same as that of the magnetic material filled in the rest portion of the peripheral portion 60.

In addition, permeability of the magnetic material filled in the central portion of the magnetic body 10 and permeability of the magnetic material filled in the rest portion of the peripheral portion 60 may be different from each other.

Figure 4:
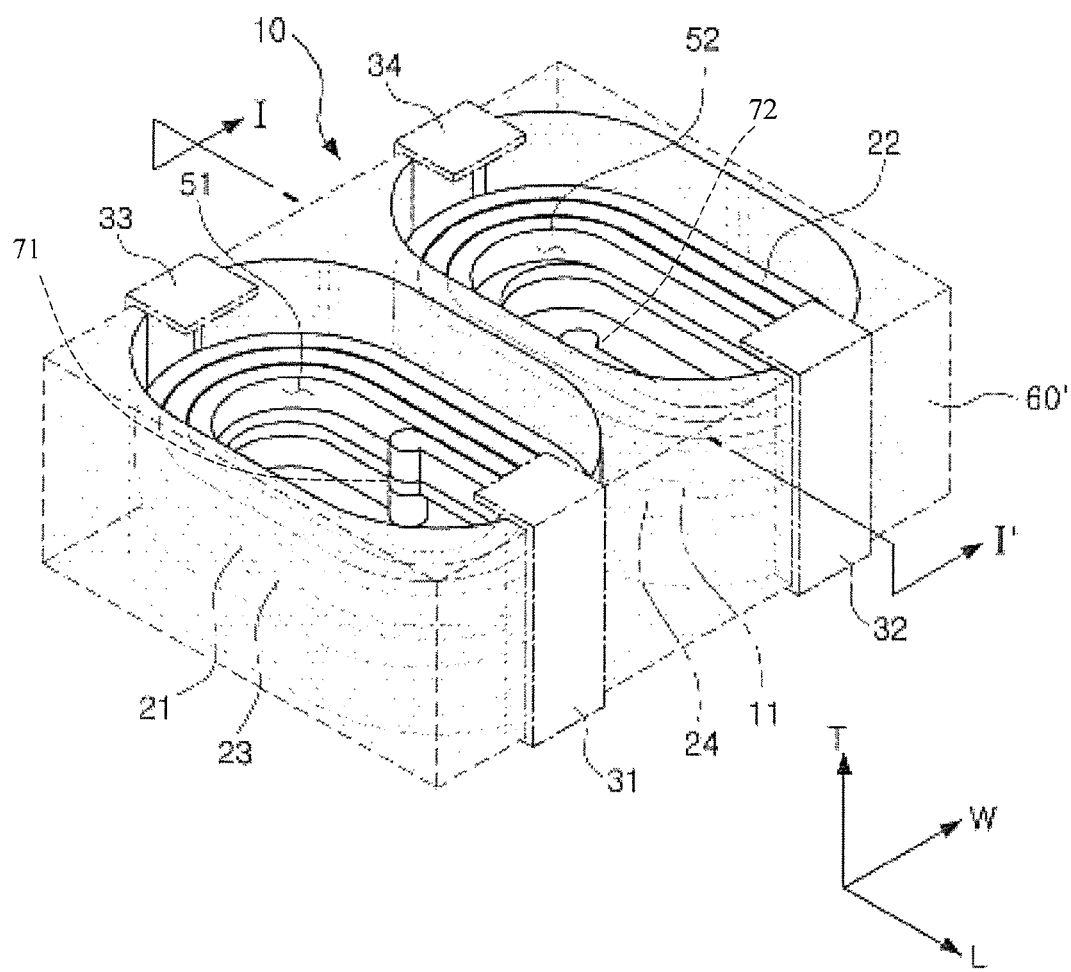
FIG. 4 is an internal perspective view of a coil component according to another exemplary embodiment in the present disclosure.

FIG. 4 is an internal perspective view of the coil component according to another exemplary embodiment in the present disclosure.

Figure 5:
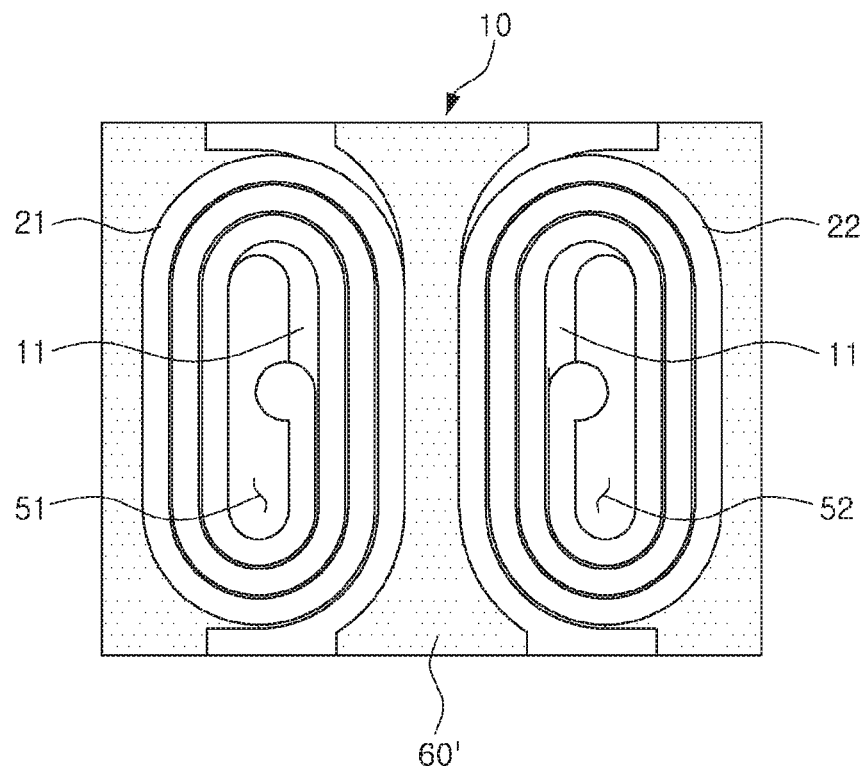
FIG. 5 is a plan view of the coil component of FIG. 4.

FIG. 5 is a plan view of the coil component of FIG. 4.

Figure 6:
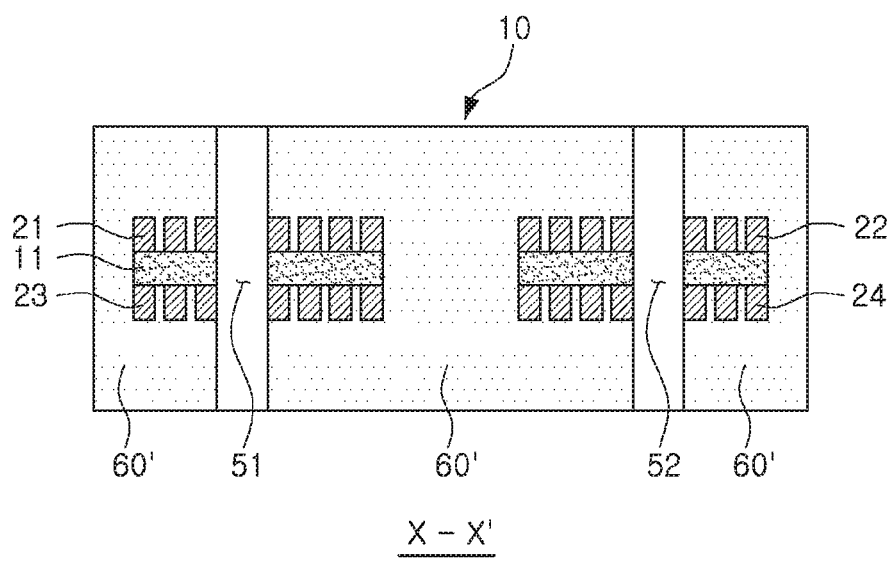
FIG. 6 is a cross-sectional view taken along line X-X' of FIG. 4.

FIG. 6 is a cross-sectional view taken along line X-X' of FIG. 4.

Referring to FIGS. 4 through 6, in an coil component according to another exemplary embodiment in the present disclosure, the magnetic body 10 may include cover parts disposed while having the first to fourth coil portions 21, 22, 23, and 24 therebetween, in addition to the coil component according to an exemplary embodiment in the present disclosure, wherein a region 60' corresponding to the peripheral portion 60 among the cover parts may have greater permeability than a region corresponding to the first and second core portions 51 and 52. On the other hand, the cover parts of the exemplary embodiment illustrated in FIGS. 1 through 3 may have the same permeability as the first and second core portions 51 and 52.

In addition, a region corresponding to the central portion of the magnetic body 10 among the cover parts may have greater permeability than the region corresponding to the first and second core portions 51 and 52.

Since characteristics of the coil component according to another exemplary embodiment in the present disclosure are the same as those of the coil component according to an exemplary embodiment in the present disclosure except for the above-mentioned characteristics, overlapped descriptions will be omitted.

The following Table 1 shows inductance values, a direct current (DC) resistance (Rdc) values, and coupling coefficient values of the coil components according to the exemplary embodiments (Inventive Example 1 and Inventive Example 2) in the present disclosure, and a general non-coupled inductor (Comparative Example) as a Comparative Example.

The Inventive Example 1 illustrates the coil component according to an exemplary embodiment in the present disclosure, and the Inventive Example 2 illustrates the coil component according to another exemplary embodiment in the present disclosure.

TABLE 1

| Item | Comparative Example | Inventive Example 1 | Inventive Example 2 |
|---|---|---|---|
| Self Inductance [μH] | 0.950 | 0.976 | 0.994 |
| Rdc [mOhm] | 35.53 | 35.53 | 35.53 |
| Coupling Coefficient | 0.10184 | 0.087545 | 0.086208 |

Referring to the Table 1, it may be seen that the coupling coefficients of the coil components according to the exemplary embodiments in the present disclosure are reduced as much as 15% or more as compared to the general non-coupled inductor, the Comparative Example.

Board for Mounting Coil Component

Figure 7:
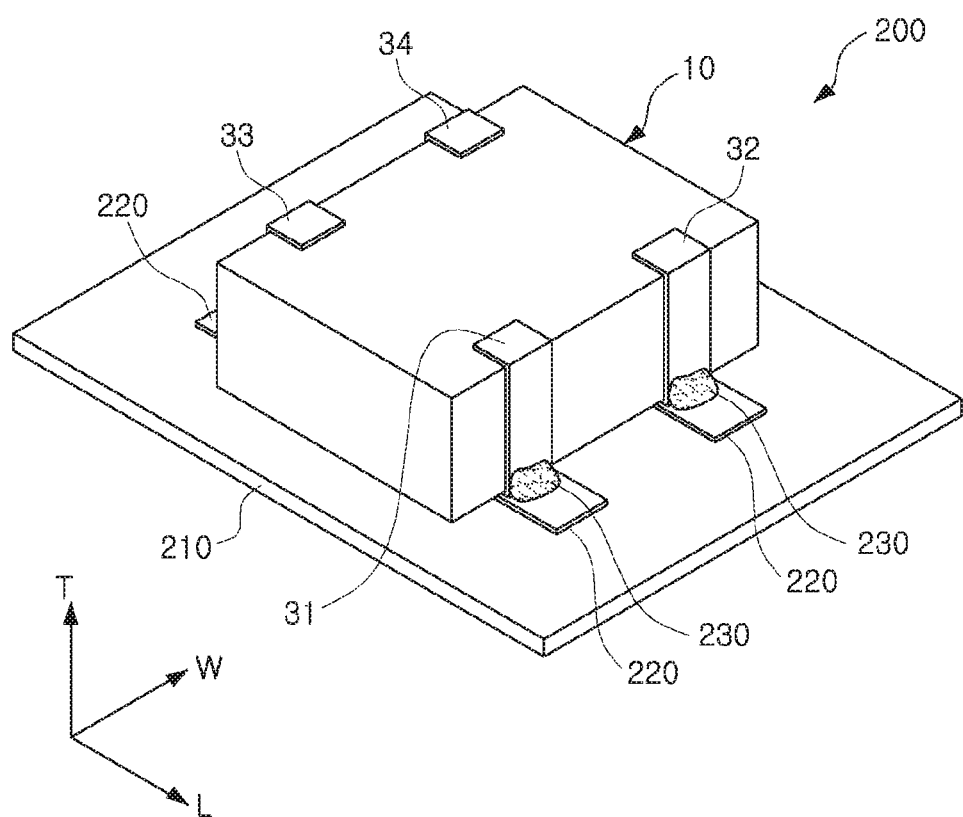
FIG. 7 is a perspective view illustrating a figure in which the coil component of FIG. 1 is mounted on a printed circuit board.

FIG. 7 is a perspective view illustrating a figure in which the coil component of FIG. 1 is mounted on a printed circuit board.

Referring to FIG. 7, a board 200 for mounting a coil component according to another exemplary embodiment in the present disclosure may include a printed circuit board 210 on which the coil component is mounted to be horizontal, and a plurality of electrode pads 220 formed on a top surface of the printed circuit board 210 to be spaced apart from each other.

In this case, the coil component may be electrically connected to the printed circuit board 210 by a solder 230 in a state in which the first to fourth external electrodes 31, 32, 33 and 34 are each disposed on the respective electrode pads 220 to be in contact with each other.

Except for the above-mentioned description, a description of characteristics overlapped with those of the coil component according to the exemplary embodiments in the present disclosure described above will be omitted.

As set forth above, according to the exemplary embodiments in the present disclosure, the coil component may be implemented in the noncoupled inductor array type in which the plurality of coil portions are not affected each other by the magnetic flux and a coupling coefficient reduction effect between the plurality of coil portions is excellent, by disposing the plurality of coil portions to be spaced apart from each other and using materials having different degrees of permeability depending on regions of the magnetic body. Further, due to the above-mentioned array type, the mounting area may be reduced.

Further, the respective coils have a symmetrical structure in a shape in a mirror on the basis of the central portion of the coil component, such that the inductances of the respective coils may be implemented to be the same, thereby reducing the mounting area and increasing efficiency of the inductor array chip.

While exemplary embodiments have been shown and described above, it will be apparent to those skilled in the art that modifications and variations could be made without departing from the scope of the present invention as defined by the appended claims.

What is claimed is:

1. A coil component comprising:
a magnetic body including first and second coil portions disposed on one surface of a substrate and disposed on opposite sides of a central portion of the magnetic body, and third and fourth coil portions disposed on the other surface of the substrate and disposed on the opposite sides of the central portion of the magnetic body; and
first to fourth external electrodes disposed on an external surface of the magnetic body and connected to the first to fourth coil portions,
wherein the first coil portion and the third coil portion have a first core portion, the second coil portion and the fourth coil portion have a second core portion, and a peripheral portion disposed outwardly of the first to fourth coil portions has greater permeability than that of the first and second core portions, and
the first coil portion and the third coil portion are connected to each other by a via, and the second coil portion and the fourth coil portion are connected to each other by another via.

2. The coil component of claim 1, wherein the central portion of the magnetic body has greater permeability than that of the first and second core portions.

3. The coil component of claim 1, wherein each of the first to fourth coil portions has coil density in regions adjacent to the central portion of the magnetic body higher than that in regions adjacent to end portions of the magnetic body.

4. The coil component of claim 1, wherein the first and second external electrodes are input terminals, and the third and fourth external electrodes are output terminals.

5. The coil component of claim 1, wherein the first coil portion to the fourth coil portion have the same length as each other.

6. The coil component of claim 1, wherein the magnetic body includes cover parts disposed while having the first to fourth coil portions therebetween, and
a region corresponding to the peripheral portion among the cover parts has greater permeability than that of a region corresponding to the first and second core portions.

7. The coil component of claim 6, wherein a region corresponding to the central portion of the magnetic body among the cover parts has greater permeability than that of the region corresponding to the first and second core portions.

8. A board for mounting a coil component, the board comprising:
a printed circuit board having a plurality of electrode pads disposed thereon; and
the coil component installed on the printed circuit board, wherein the coil component includes:
a magnetic body including first and second coil portions disposed on one surface of a substrate and disposed on opposite sides of a central portion of the magnetic body, and third and fourth coil portions disposed on the other surface of the substrate and disposed on the opposite sides of the central portion of the magnetic body; and
first to fourth external electrodes disposed on an external surface of the magnetic body and connected to the first to fourth coil portions,
the first coil portion and the third coil portion have a first core portion, the second coil portion and the fourth coil portion have a second core portion, and a peripheral portion disposed outwardly of the first to fourth coil portions has greater permeability than that of the first and second core portions, and
the first coil portion and the third coil portion are connected to each other by a via, and the second coil portion and the fourth coil portion are connected to each other by another via.

9. The board of claim 8, wherein the central portion of the magnetic body has greater permeability than that of the first and second core portions.

10. The board of claim 8, wherein each of the first to fourth coil portions has coil density in regions adjacent to the central portion of the magnetic body higher than that in regions adjacent to end portions of the magnetic body.

11. The board of claim 8, wherein the first and second external electrodes are input terminals, and the third and fourth external electrodes are output terminals.

12. The board of claim 8, wherein the first coil portion to the fourth coil portion have the same length as each other.

13. The board of claim 8, wherein the magnetic body includes cover parts disposed while having the first to fourth coil portions therebetween, and
a region corresponding to the peripheral portion among the cover parts has greater permeability than that of a region corresponding to the first and second core portions.

14. The board of claim 13, wherein a region corresponding to the central portion of the magnetic body among the cover parts has greater permeability than that of the region corresponding to the first and second core portions.

* * * * *